United States Patent
Fuchikami et al.

(10) Patent No.: US 9,195,933 B2
(45) Date of Patent: Nov. 24, 2015

(54) ELECTRONIC CIRCUIT AND ELECTRONIC DEVICE INCLUDING THE SAME

(71) Applicant: Rohm Co., Ltd., Kyoto (JP)

(72) Inventors: Takaaki Fuchikami, Kyoto (JP); Noriyuki Ema, Kyoto (JP); Hiromitsu Kimura, Kyoto (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 226 days.

(21) Appl. No.: 14/045,700

(22) Filed: Oct. 3, 2013

(65) Prior Publication Data

US 2014/0098926 A1 Apr. 10, 2014

(30) Foreign Application Priority Data

Oct. 4, 2012 (JP) .................... 2012-222107

(51) Int. Cl.
| | |
|---|---|
| H03K 23/00 | (2006.01) |
| G06M 1/10 | (2006.01) |
| H03K 21/02 | (2006.01) |
| H03K 21/40 | (2006.01) |
| H03K 21/38 | (2006.01) |
| H03K 21/12 | (2006.01) |

(52) U.S. Cl.
CPC .............. G06M 1/10 (2013.01); H03K 21/023 (2013.01); H03K 21/12 (2013.01); H03K 21/38 (2013.01); H03K 21/403 (2013.01)

(58) Field of Classification Search
None
See application file for complete search history.

(56) References Cited

U.S. PATENT DOCUMENTS

| | | | | |
|---|---|---|---|---|
| 3,636,549 A | * | 1/1972 | Berman et al. | ............. 340/309.8 |
| 6,078,275 A | * | 6/2000 | Borgen | ......................... 341/144 |
| 2013/0002274 A1 | * | 1/2013 | Saneyoshi et al. | ........ 324/750.01 |
| 2014/0084973 A1 | * | 3/2014 | Tokioka et al. | ................ 327/143 |

FOREIGN PATENT DOCUMENTS

JP 2007-104020 4/2007

* cited by examiner

Primary Examiner — Tuan T Lam
(74) Attorney, Agent, or Firm — Fish & Richardson P.C.

(57) ABSTRACT

A counter includes: a count processing circuit including a nonvolatile register; a regulator receiving voltage from a direct current power supply, generating power supply voltage based on the received voltage for the count processing circuit, and supplying the power supply voltage to the count processing circuit; and a delay circuit receiving the power supply voltage and supplying a count signal to the count processing circuit after the power supply voltage is supplied to the count processing circuit. After having received the power supply voltage from the regulator, the count processing circuit updates a count value in response to the count signal and holds the updated count value in the nonvolatile register in a non-volatile manner.

8 Claims, 13 Drawing Sheets

ELECTRONIC CIRCUIT AND ELECTRONIC DEVICE INCLUDING THE SAME

BACKGROUND OF THE INVENTION

1. Field of the Invention

The present invention relates generally to an electronic circuit and an electronic device including the same, and more specifically to an electronic circuit including a storage unit to hold information in a nonvolatile manner, and an electronic device including the electronic circuit.

2. Description of the Background Art

A pulse counter counts how many pulses are received. Japanese Patent Laying-Open No. 2007-104020 discloses an example of a pulse counter.

The pulse counter of Japanese Patent Laying-Open No. 2007-104020 includes a common input terminal, a common input circuit, a comparator circuit, a hold circuit, a reset circuit, a level determination unit, a reset signal generation unit, and a count unit. The common input terminal is connected to a first or second cable. The first cable is connected to an output terminal of another device. The other device is provided with a no-voltage contact outputting a pulse therefrom. Furthermore, the second cable is connected to an output terminal of an externally provided current transformer. In this current transformer, the pulse output from the no-voltage contact provided in the other device is detected.

The common input circuit is connected to the common input terminal and thus accommodates both an output from the other device and that from the current transformer. The comparator circuit receives an output of the common input circuit and a set reference potential. The hold circuit holds the high (H) level of an output of the comparator circuit. The reset circuit resets the output of the comparator circuit held by the hold circuit. The level determination unit determines the output in level of the comparator circuit held by the hold circuit. The reset signal generation unit outputs a reset signal to the reset circuit when the level determination unit outputs an H level determination signal. The count unit counts the H level determination signal. The above configuration allows a pulse received from the other device and that received from the current transformer to be received via a common input terminal if the pulses are received in different systems, respectively.

Generally, a pulse counter includes a microcomputer or dedicated counter integrated circuit (IC), a clock oscillator, and a nonvolatile memory. The clock oscillator supplies a clock signal to the microcomputer. The nonvolatile memory holds a count value in a non-volatile manner. The nonvolatile memory is for example an electrically erasable programmable read-only memory (EEPROM).

When the pulse counter is powered on, the clock oscillator supplies the clock signal to the microcomputer. This allows the microcomputer to perform a count processing. Initially, the microcomputer reads a count value held in the EEPROM. A pulse or count signal is then supplied to the microcomputer. The microcomputer performs the count processing based on the count value and the count signal. A result of the count processing is stored to the EEPROM.

When the pulse counter is powered on, the clock oscillator starts to oscillate. However, it requires some time before the clock oscillator provides steady operation. Furthermore, it also requires some time to read/write from/to the EEPROM. A typical pulse counter thus requires some time after it is powered on before writing to the EEPROM is completed.

Generally, conventional electronic circuits cannot perform signal processing after the electronic circuit receives voltage from a power supply before some period of time elapses. Accordingly, a voltage signal (e.g., a count signal) applied to start signal processing must be supplied to the electronic circuit from an external circuit some period of time after the electronic circuit has received voltage from the power supply.

SUMMARY OF THE INVENTION

The present invention contemplates an electronic circuit capable of signal processing without receiving voltage from a power supply independent of a voltage signal applied to start signal processing, and an electronic device including the electronic circuit.

The present invention in one aspect provides an electronic circuit including: a signal processing circuit including a storage unit to hold information in a non-volatile manner; a voltage processing circuit receiving voltage from a voltage source, generating power supply voltage based on the received voltage for the signal processing circuit, and supplying the power supply voltage to the signal processing circuit; and a delay circuit receiving the power supply voltage and supplying a voltage signal to the signal processing circuit after the power supply voltage is supplied to the signal processing circuit. After having received the power supply voltage from the voltage processing circuit, the signal processing circuit updates the information in response to the voltage signal and holds the updated information in the storage unit in the non-volatile manner.

Preferably, the delay circuit monitors the power supply voltage, and once the power supply voltage has attained a value equal to or larger than a reference value, the delay circuit outputs a reset cancel signal to the signal processing circuit for allowing the signal processing circuit to shift from a state disallowing the information to be updatable to a state allowing the information to be updatable, and after the delay circuit has output the reset cancel signal to the signal processing circuit, the delay circuit outputs the voltage signal to the signal processing circuit.

Preferably, the voltage source is a direct current power supply. When the direct current power supply is turned on, the voltage processing circuit generates the power supply voltage based on direct current voltage provided from the direct current power supply.

Preferably, the voltage source is a pulsed power supply that outputs pulsed voltage having one of positive and negative polarities. The voltage processing circuit includes a half wave rectification circuit corresponding to the polarity of the pulsed voltage. The half wave rectification circuit generates the power supply voltage by subjecting the pulsed voltage received from the pulsed power supply to half wave rectification.

Preferably, the voltage source is a pulsed power supply that outputs pulsed voltage of both positive and negative polarities. The voltage processing circuit includes a full wave rectification circuit. The full wave rectification circuit generates the power supply voltage by subjecting the pulsed voltage received from the pulsed power supply to full wave rectification.

Preferably, the voltage source is a pulsed power supply that outputs pulsed voltage of both positive and negative polarities. The voltage processing circuit includes a first half wave rectification circuit and a second half wave rectification circuit. The signal processing circuit includes a first signal processing unit and a second signal processing unit. The first and second signal processing units have first and second storage units, respectively. The first half wave rectification circuit generates first power supply voltage as the power supply voltage by subjecting to half wave rectification the pulsed voltage output by the pulsed power supply that is positive in polarity. The second half wave rectification circuit generates second power supply voltage as the power supply voltage by subjecting to half wave rectification the pulsed voltage output by the pulsed power supply that is negative in polarity. The first signal processing unit receives the first power supply voltage generated by the first half wave rectification circuit. The second signal processing unit receives the second power supply voltage generated by the second half wave rectification circuit.

The present invention in another aspect provides a counter for counting how many times a power supply is turned on. The counter includes: a signal processing circuit receiving power supply voltage as the power supply is turned on, and holding in a non-volatile manner a count value indicating how many times the power supply is turned on; a first delay circuit monitoring the power supply voltage and outputting a first voltage signal to the signal processing circuit once the power supply voltage has attained a value equal to or larger than a reference value; and a second delay circuit outputting a second voltage signal to the signal processing circuit after the first delay circuit has output the first voltage signal. In response to the first voltage signal received, the signal processing circuit shifts from a state disallowing the count value to be updatable to a state allowing the count value to be updatable, and furthermore, in response to the second voltage signal received, the signal processing circuit updates the count value and holds the updated count value in the non-volatile manner.

The present invention in still another aspect provides an electronic device including an electronic circuit including: a signal processing circuit including a storage unit to hold information in a non-volatile manner; a voltage processing circuit receiving voltage from a voltage source, generating power supply voltage based on the received voltage for the signal processing circuit, and supplying the power supply voltage to the signal processing circuit; and a delay circuit receiving the power supply voltage and supplying a voltage signal to the signal processing circuit after the power supply voltage is supplied to the signal processing circuit. After having received the power supply voltage from the voltage processing circuit, the signal processing circuit updates the information in response to the voltage signal and holds the updated information in the storage unit in the non-volatile manner.

The present invention can thus provide an electronic circuit capable of signal processing without receiving voltage from a power supply independent of a voltage signal applied to start signal processing, and an electronic device including the electronic circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter reference will be made to the drawings to describe the present invention in embodiments. Note that in the figures, identical or corresponding components are identically denoted and will not be described repeatedly.

First Embodiment

Figure 1:
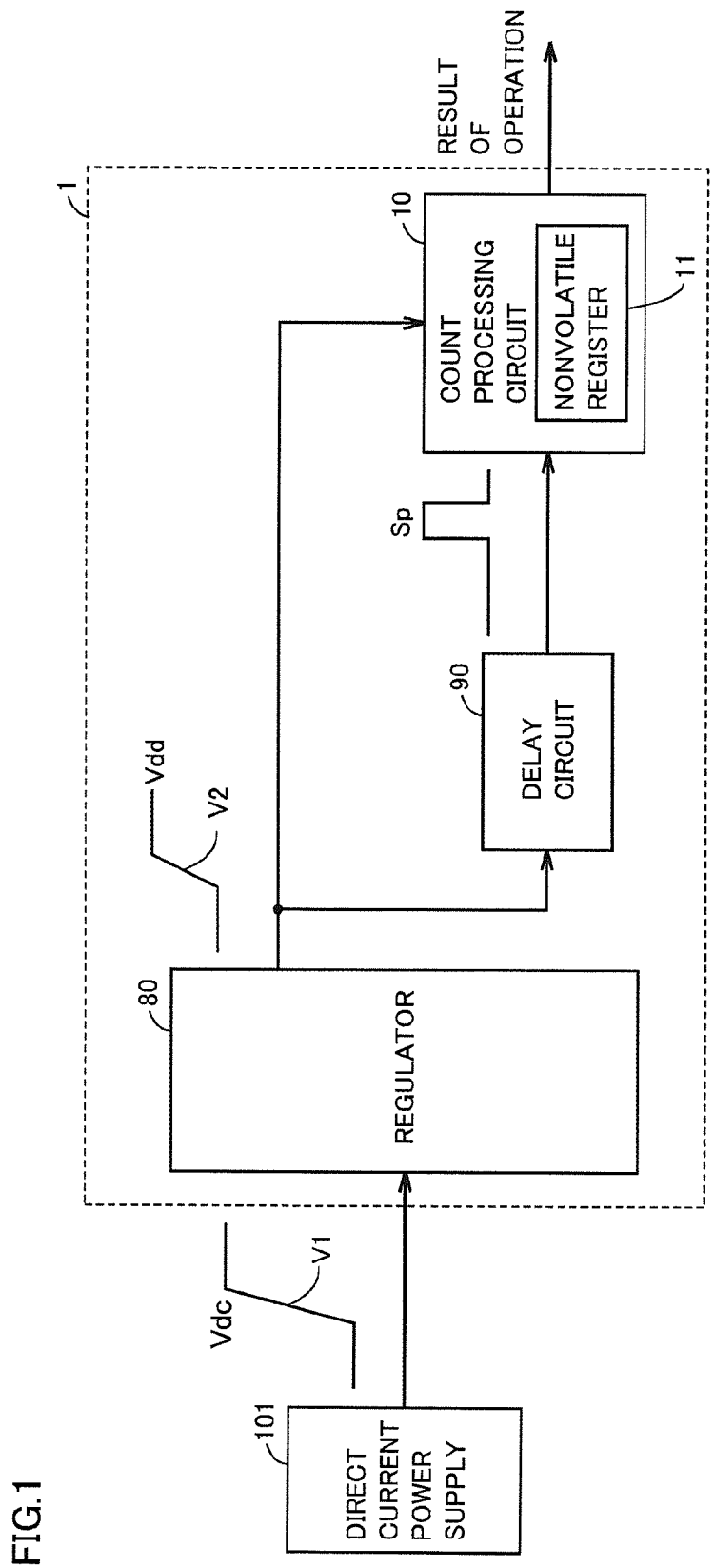
FIG. 1 is a block diagram schematically showing in configuration an electronic circuit according to a first embodiment of the present invention.

FIG. 1 is a block diagram schematically showing in configuration a counter according to a first embodiment of the present invention. With reference to FIG. 1, a direct current power supply 101 inputs voltage V1 to an external device (not shown). Voltage V1 in a steady state attains direct current voltage Vdc. A counter 1 is provided for counting how many times direct current power supply 101 inputs direct current voltage Vdc to the external device. Counter 1 includes a count processing circuit (a signal processing circuit) 10, a regulator 80, and a delay circuit 90. Count processing circuit 10 includes a nonvolatile register 11. Note that the counter is one example of the "electronic circuit" according to the present invention, and the electronic circuit is not limited thereto in type. Furthermore, regulator 80 is one example of the "voltage processing circuit" according to the present invention. Counter 1 may count how many times direct current power supply 101 generates direct current voltage Vdc, rather than how many times direct current power supply 101 inputs direct current voltage Vdc to the external device.

Direct current power supply 101 supplies voltage V1 to regulator 80. Regulator 80 generates voltage V2 based on voltage V1. Voltage V1 input to regulator 80 rises from a reference potential to direct current voltage Vdc. As direct current voltage Vdc is supplied to regulator 80, regulator 80 generates power supply voltage Vdd. Power supply voltage Vdd is supplied to count processing circuit 10 and is also supplied to delay circuit 90. Note that the direct current voltage is one example of the "input voltage" according to the present invention.

Delay circuit 90 generates a count signal Sp based on power supply voltage Vdd. Delay circuit 90 outputs the generated count signal Sp to count processing circuit 10. Count signal Sp is output delayed than power supply voltage Vdd supplied to delay circuit 90.

Count processing circuit 10 counts how many times count signal Sp is received. Count processing circuit 10 receives power supply voltage Vdd and thereafter receives count signal Sp from delay circuit 90. Nonvolatile register 11 holds in a non-volatile manner a count value (or information) indicating how many times count signal Sp is received.

Figure 2:
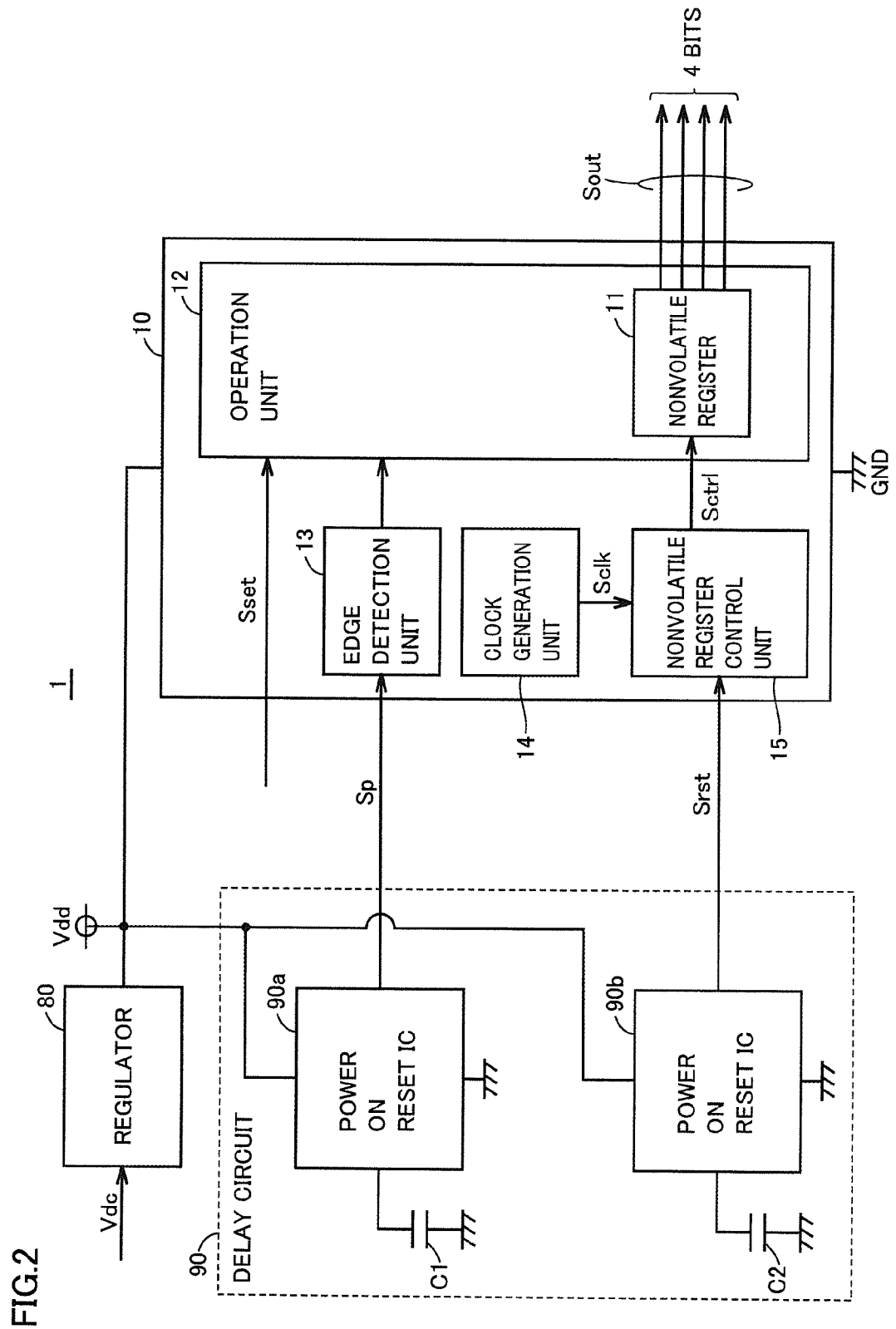
FIG. 2 is a block diagram for more specifically illustrating in configuration a signal processing circuit and a delay circuit shown in FIG. 1.

FIG. 2 is a block diagram for more specifically illustrating in configuration count processing circuit 10 and delay circuit 90 shown in FIG. 1. With reference to FIG. 2, counter 1 is for example a 4-bit counter. Count processing circuit 10 includes an operation unit 12, an edge detection unit 13, a clock generation unit 14, and a nonvolatile register control unit 15. Operation unit 12 has nonvolatile register 11.

Edge detection unit 13 detects whether count signal Sp is received or not. More specifically, edge detection unit 13 detects at least one of a rising edge and a falling edge of count signal Sp. When edge detection unit 13 detects an edge of count signal Sp, edge detection unit 13 outputs a signal to operation unit 12.

Operation unit 12 receives the signal from edge detection unit 13 and performs a count processing. The count processing will more specifically be described hereinafter. In operation unit 12, whether a count value should be incremented or decremented is set by an increment/decrement setting signal Sset. In the present embodiment, the count value is set to be decremented. Operation unit 12 outputs a 4-bit output signal Sout indicating a result of the count processing.

Clock generation unit 14 generates a clock signal Sclk to allow nonvolatile register control unit 15 to operate. Nonvolatile register control unit 15 receives clock signal Sclk and outputs a control signal Sctrl to control nonvolatile register 11.

Nonvolatile register 11 holds in a non-volatile manner the count value indicating the result of the count processing by operation unit 12. The count value held in nonvolatile register 11 is output for example to a microcomputer (not shown) external to counter 1. Nonvolatile register 11 is implemented with ferroelectric substance. Nonvolatile register 11 is implemented for example as, but not limited to, a nonvolatile flip-flop or ferroelectric random access memory (FeRAM).

Regulator 80 generates voltage V2 based on voltage V1. When voltage V1 input to regulator 80 reaches direct current voltage Vdc, regulator 80 generates power supply voltage Vdd. Power supply voltage Vdd is supplied to count processing circuit 10 and is also supplied to delay circuit 90.

Delay circuit 90 outputs a reset cancel signal Srst and count signal Sp to count processing circuit 10 after power supply voltage Vdd is supplied to count processing circuit 10. Delay circuit 90 allows controlling a delay time elapsing after power supply voltage Vdd is supplied before reset cancel signal Srst is output and a delay time elapsing after power supply voltage Vdd is supplied before count signal Sp is output.

More specifically, delay circuit 90 includes power on reset ICs 90a and 90b and capacitors C1 and C2. Power on reset IC 90a outputs count signal Sp to edge detection unit 13. Power on reset IC 90b outputs reset cancel signal Srst to nonvolatile register control unit 15. Nonvolatile register control unit 15 having received reset cancel signal Srst shifts from a state disallowing the count value that is held in nonvolatile register 11 to be updatable to a state allowing the count value to be updatable. Accordingly, count processing circuit 10 must receive reset cancel signal Srst before count signal Sp.

When power on reset ICs 90a and 90b output a signal depends on the magnitude in capacitance of capacitors C1 and C2. The larger the capacitors are in capacitance, the later power on reset ICs 90a and 90b output a signal. Capacitor C1 is set to be larger in capacitance than capacitor C2. Thus, power on reset IC 90b outputs reset cancel signal Srst before power on reset IC 90a outputs count signal Sp.

It is thus important to provide delay circuit 90 and allow delay circuit 90 to control delay time. Power on reset ICs 90a, 90b and capacitors C1, C2 are one example of elements of delay circuit 90, and delay circuit 90 is not limited thereto in configuration. For example, there also exists a power on reset IC that can control delay time without using a capacitor. Furthermore, power on reset IC 90b may have an output input to power on reset IC 90a. Delay circuit 90 may be configured without a power on reset IC.

Figure 3:
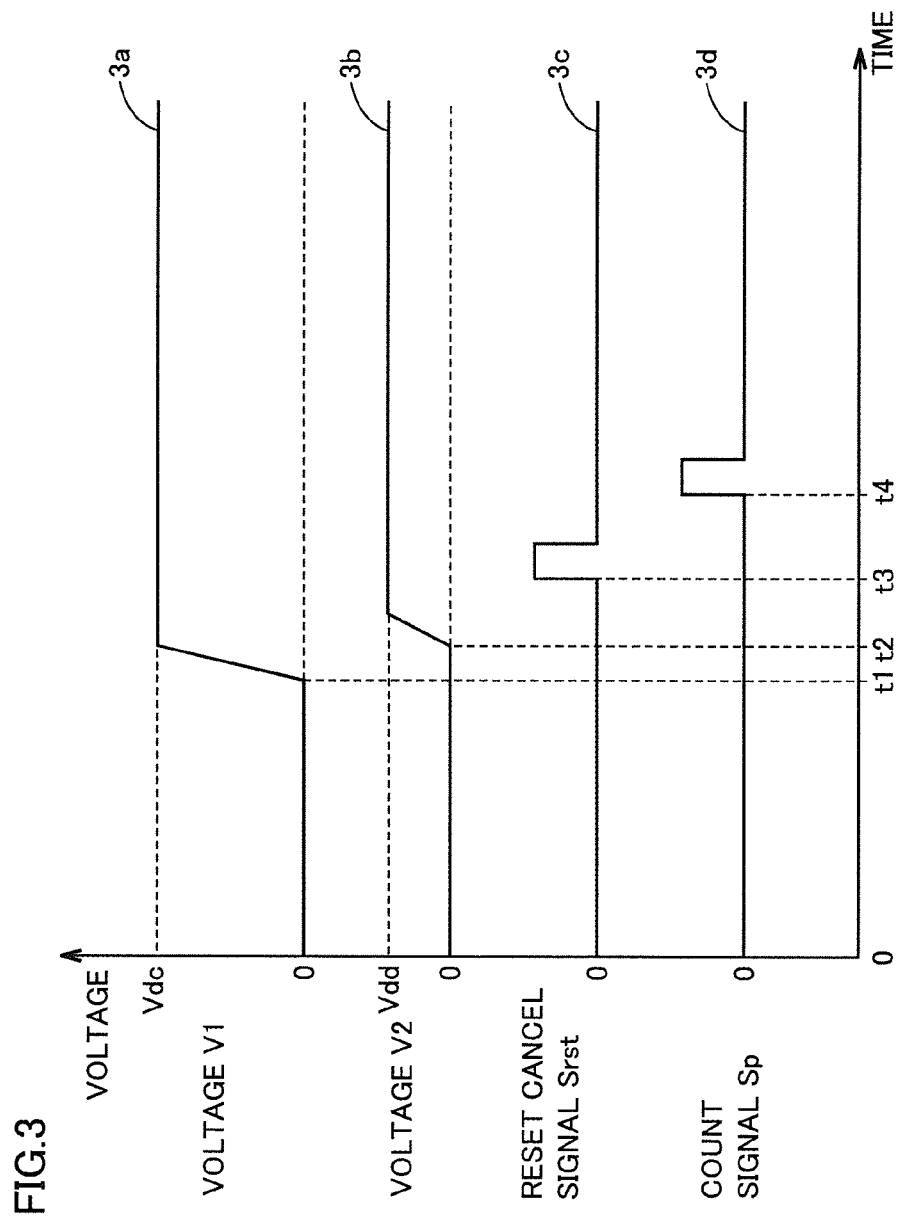
FIG. 3 is timing plots representing a relationship between input voltage, power supply voltage, and a voltage signal in the FIG. 2 electronic circuit as time elapses.

FIG. 3 is timing plots representing a relationship between voltage V1, voltage V2, reset cancel signal Srst, and count signal Sp in the FIG. 2 counter 1 as time elapses. With reference to FIG. 3, the axis of abscissa represents time, and the axis of ordinate represents voltage V1 output from direct current power supply 101, voltage V2 generated by regulator 80, reset cancel signal Srst, and count signal Sp in voltage, as indicated by waveforms 3a, 3b, 3c, and 3d, respectively. When measurement starts is indicated as a reference time (0).

As counted from the reference time, when time t1 has arrived, direct current power supply 101 supplies voltage V1 to regulator 80. Subsequently, voltage V1 reaches direct current voltage Vdc.

As counted from the reference time, when time t2 has arrived, regulator 80 supplies voltage V2. Subsequently, voltage V2 reaches power supply voltage Vdd. Power supply voltage Vdd is supplied to count processing circuit 10 and power on reset ICs 90a and 90b.

As counted from the reference time, when time t3 has arrived, power on reset IC 90b outputs reset cancel signal Srst to nonvolatile register control unit 15. This allows nonvolatile register control unit 15 to shift from the state disallowing a count value that is held in nonvolatile register 11 to be updatable to the state allowing the count value to be updatable.

As counted from the reference time, when time t4 has arrived, power on reset IC 90a outputs count signal Sp. Edge detection unit 13 detects an edge of count signal Sp and outputs a signal. Operation unit 12 receives the signal from edge detection unit 13 and in response thereto performs count processing. A result of the count processing is stored to nonvolatile register 11.

Figure 4:
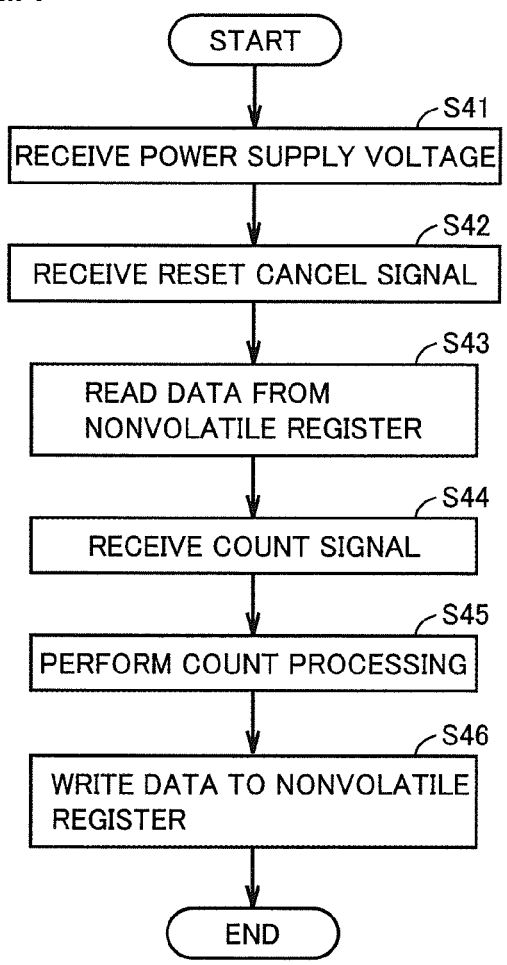
FIG. 4 is a flowchart of a procedure of a count processing performed in the electronic circuit shown in FIG. 2.

FIG. 4 is a flowchart of a procedure of count processing performed in counter 1 shown in FIG. 2. With reference to FIG. 2 and FIG. 4, direct current power supply 101 supplies direct current voltage Vdc to regulator 80. This starts the process.

In step S41, regulator 80 generates voltage V2 based on voltage V1. Voltage V2 reaches power supply voltage Vdd. Power supply voltage Vdd is supplied to count processing circuit 10 and is also supplied to delay circuit 90.

In step S42, power on reset ICs 90a and 90b monitor the value of voltage V2 in voltage. Once voltage V2 has reached a reference value or higher, power on reset IC 90b outputs reset cancel signal Srst to nonvolatile register control unit 15. This allows nonvolatile register control unit 15 to shift from the state disallowing a count value that is held in nonvolatile register 11 to be updatable to the state allowing the count value to be updatable.

In step S43, operation unit 12 reads the count value held in nonvolatile register 11.

In step S44, edge detection unit 13 detects an edge of count signal Sp and outputs a signal. Operation unit 12 receives the signal from edge detection unit 13. Note that steps S43 and S44 may be switched in order.

In step S45, operation unit 12 operates a count value based on the count value read from nonvolatile register 11, the signal received from edge detection unit 13, and a setting to increment/decrement the count value. More specifically, operation unit 12 operates in response to the signal received from edge detection unit 13 to decrement the count value of nonvolatile register 11.

In step S46, operation unit 12 writes to nonvolatile register 11 a count value indicating a result of the operation. This updates the count value held in nonvolatile register 11. This step completes a series of steps of the process.

Count processing circuit 10 thus counts how many times it receives count signal Sp from delay circuit 90. How many times count signal Sp is received equals how many times direct current power supply 101 inputs direct current voltage Vdc to the external device (not shown). Counter 1 according to the first embodiment can thus be used as a counter to count how many times the external device is powered on.

In the first embodiment, power on reset ICs 90a and 90b generate count signal Sp and reset cancel signal Srst, respectively. This eliminates the necessity of count processing circuit 10 receiving a voltage signal from a circuit external to counter 1 to start count processing. Count processing circuit 10 can perform the count processing by count signal Sp and reset cancel signal Srst.

Nonvolatile register 11 is implemented as a ferroelectric nonvolatile flip-flop or a FeRAM, as has previously been described. Nonvolatile register 11 thus consumes only a small current, e.g., slightly smaller than 0.01 mA, when it has data read/written therefrom/thereto. Furthermore, a voltage that is applied in writing data thereto is approximately 3 V. In contrast, when a conventional EEPROM has data read therefrom it consumes a current for example slightly larger than 0.1 mA, and when the conventional EEPROM has data written thereto it consumes a current for example slightly larger than 1 mA. Furthermore, when the conventional EEPROM has data written thereto it requires a high voltage of approximately 12 V. Thus counter 1 can achieve reduced power consumption. Furthermore, it is unnecessary to supply voltage to nonvolatile register 11 for holding data. This allows data to be held without substantial power consumption.

Furthermore, the ferroelectric nonvolatile flip-flop or FeRAM allows data to be read/written therefrom/thereto significantly fast (e.g., in a few ns) and also dispenses with a special command for erasing or rewriting data. The FeRAM allows byte-by-byte write. Nonvolatile register 11 thus allows data to be read/written therefrom/thereto significantly fast.

Second Embodiment

Counter 1 according to the first embodiment receives direct current voltage Vdc from direct current power supply 101. However, the input voltage supplied to the electronic circuit according to the present invention is not limited to direct current voltage Vdc. A counter according to the present embodiment receives pulsed voltage.

Figure 5:
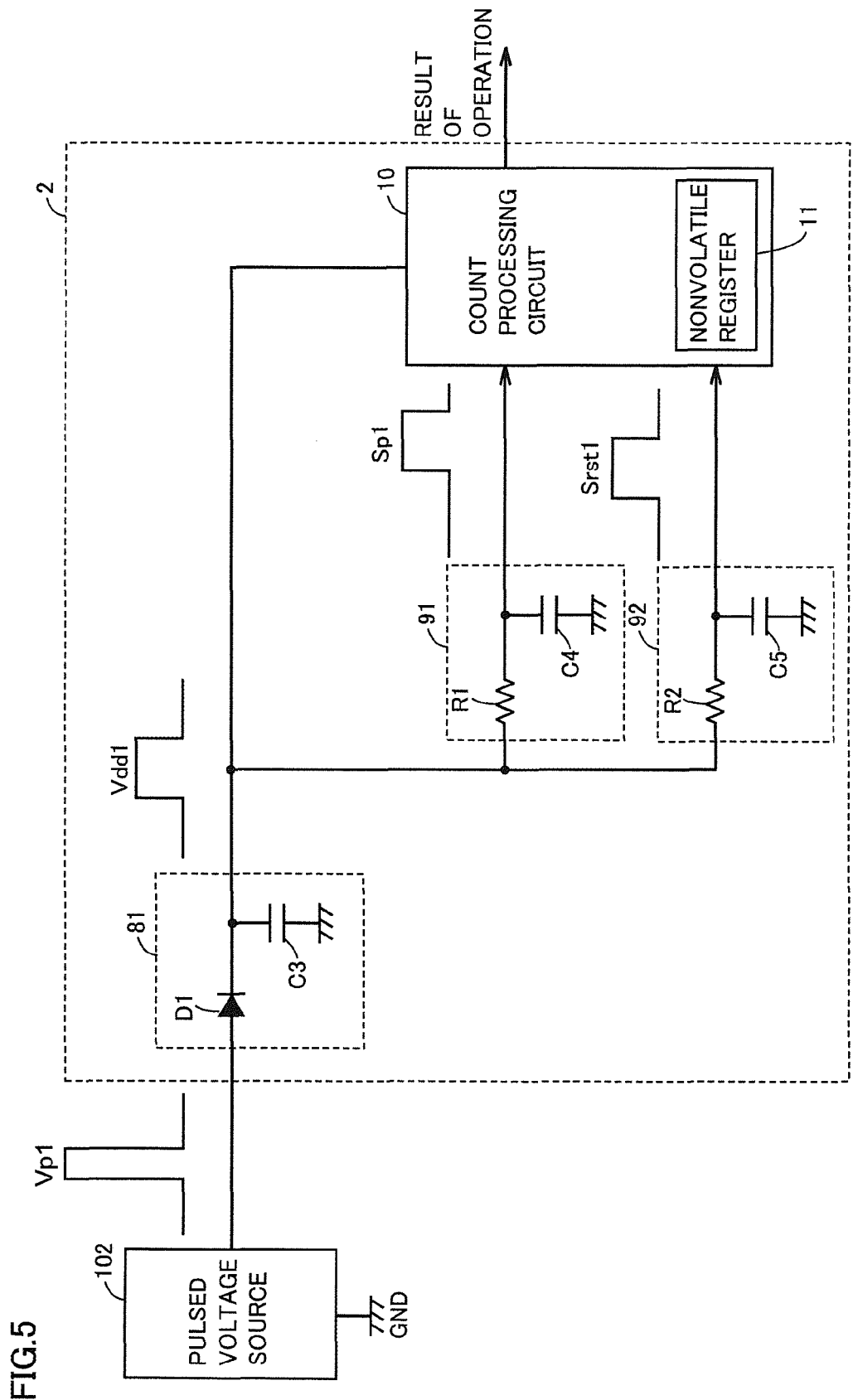
FIG. 5 is a block diagram schematically showing in configuration an electronic circuit according to a second embodiment of the present invention.

FIG. 5 is a block diagram schematically showing in configuration a counter 2 according to a second embodiment of the present invention. With reference to FIG. 5, counter 2 includes count processing circuit 10, a half wave rectification circuit 81, and delay circuits 91 and 92. The remainder of counter 2 is equivalent in configuration to that of counter 1 according to the first embodiment, and accordingly, will not be described repeatedly.

A pulsed voltage source 102 outputs positive pulsed voltage Vp1 to half wave rectification circuit 81. Pulsed voltage source 102 is for example a sensor having an A/D conversion function. When this sensor senses for example that a subject to be sensed exists, the sensor outputs pulsed voltage Vp1. Note that positive pulsed voltage Vp1 is one example of the "input voltage" according to the present invention. Pulsed voltage source 102 is not limited to the above sensor. Pulsed voltage Vp1 may for example be a logic signal output from a digital IC.

Half wave rectification circuit 81 includes a diode D1 and a capacitor C3. Diode D1 is provided to have an anode facing pulsed voltage source 102. Capacitor C3 is provided between the cathode of diode D1 and a ground node GND. Diode D1 subjects pulsed voltage Vp1 to half wave rectification. The pulsed voltage having undergone the half wave rectification through diode D1 is smoothed by capacitor C3. The smoothed voltage is output as power supply voltage Vdd1.

In the first embodiment, power supply voltage Vdd is direct current voltage. In the second embodiment, in contrast, power supply voltage Vdd1 is pulsed voltage. The power supply voltage is thus supplied to count processing circuit 10 for a short period of time. Furthermore, in the second embodiment, the power supply voltage has smaller electric energy than in the first embodiment. However, as has been set forth above, nonvolatile register 11 allows data to be read/written therefrom/thereto significantly fast. Furthermore, in doing so, it consumes only small electric energy. Accordingly, counter 2 according to the second embodiment can provide count processing using the electric energy of power supply voltage Vdd1 that is pulsed voltage.

Delay circuit 91 includes a resistor R1 and a capacitor C4. Resistor R1 is connected in series between half wave rectification circuit 81 and count processing circuit 10. Between resistor R1 and count processing circuit 10, capacitor C4 is provided between a ground node GND and a node provided between resistor R1 and count processing circuit 10. Delay circuit 91 receives power supply voltage Vdd1 from half wave rectification circuit 81 and generates a count signal Sp1. Delay circuit 91 supplies to count processing circuit 10 count signal Sp1 delayed than power supply voltage Vdd1 supplied to delay circuit 91.

Delay circuit 92 includes a resistor R2 and a capacitor C5. Resistor R2 is connected in series between half wave rectification circuit 81 and count processing circuit 10. Between resistor R2 and count processing circuit 10, capacitor C5 is provided between a ground node GND and a node provided between resistor R2 and count processing circuit 10. Delay circuit 92 outputs to signal processing circuit 10 a reset cancel signal Srst1 delayed than power supply voltage Vdd1 supplied to delay circuit 92.

Note that the configuration of delay circuits 91 and 92 is one exemplary configuration of the delay circuit. As described above, providing a delay circuit and allowing the delay circuit to control delay time are important, and how the delay circuit is configured is not limited to the above described configuration. The delay circuit may be configured as a circuit other than a CR circuit. Furthermore, how half wave rectification circuit 81 and delay circuits 91 and 92 are interconnected may also be changed. For example, half wave rectification circuit 81 may have an output input only to delay circuit 92 and delay circuit 92 may have an output input to delay circuit 91. This configuration can also provide a delay time controlled to allow count processing circuit 10 to receive reset cancel signal Srst1 before count signal Sp1.

After count processing circuit 10 has received power supply voltage Vdd1, count processing circuit 10 responds to count signal Sp1 received from delay circuit 91. In response to count signal Sp1, count processing circuit 10 updates information held in nonvolatile register 11. The updated information is stored to nonvolatile register 11 in a non-volatile manner.

Note that half wave rectification circuit 81 is one example of the "voltage processing circuit" according to the present invention, and its circuit configuration is not limited to the above. For example, if there is a possibility that pulsed voltage Vp1 may overshoot, a limiter that limits the overshoot or a withstand voltage protection circuit can additionally be introduced, as appropriate, at a stage preceding half wave rectification circuit 81. Similarly, delay circuits 91 and 92 are not limited to the above in circuit configuration.

Figure 6:
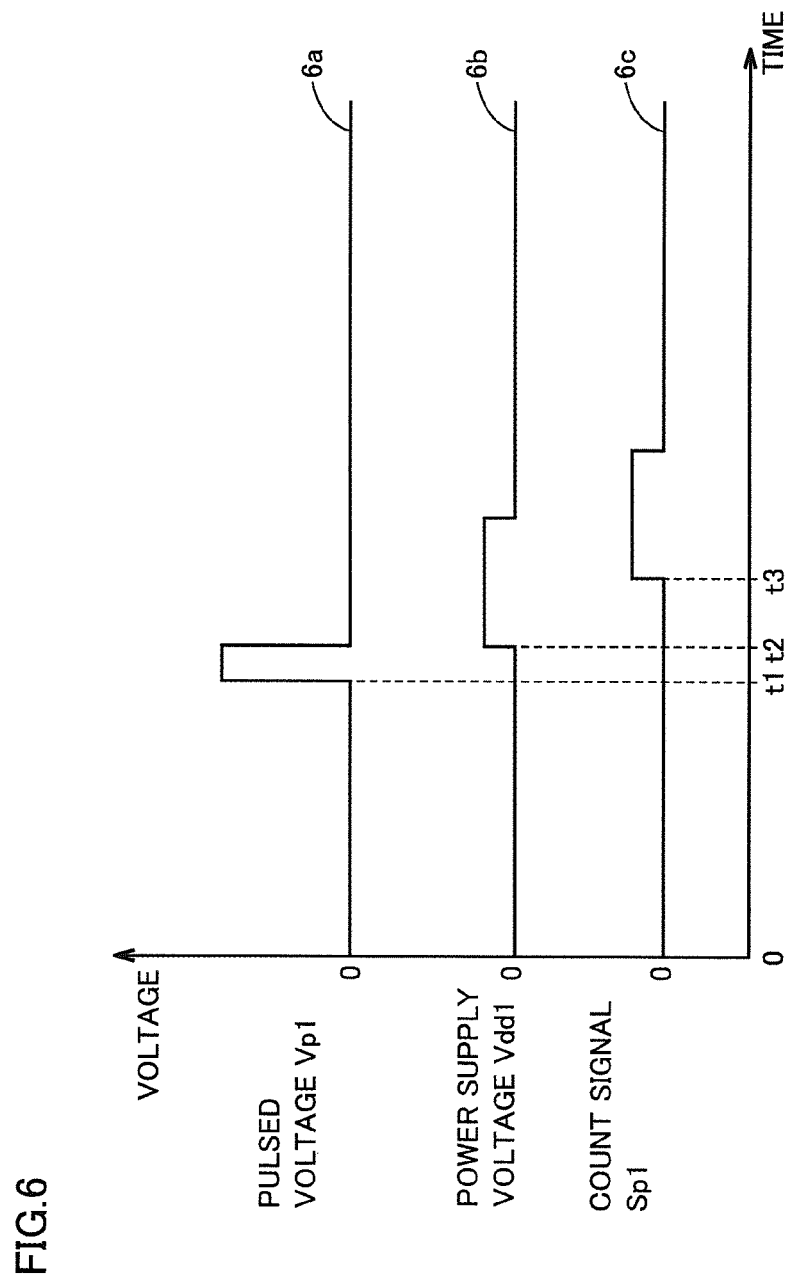
FIG. 6 is timing plots representing a relationship between input voltage, power supply voltage, and a voltage signal in the FIG. 5 electronic circuit as time elapses.

FIG. 6 is timing plots representing a relationship between pulsed voltage Vp1, power supply voltage Vdd1, and count signal Sp1 in the FIG. 5 counter 2 as time elapses. With reference to FIG. 3 and FIG. 6, waveforms 6a-6c are compared with waveforms 3a, 3b, and 3d, respectively.

As counted from the reference time, when time t1 has arrived, pulsed voltage source 102 supplies pulsed voltage Vp1 to half wave rectification circuit 81.

As counted from the reference time, when time t2 has arrived, half wave rectification circuit 81 supplies power supply voltage Vdd1. Power supply voltage Vdd1 is supplied to count processing circuit 10 and is also supplied to delay circuits 91 and 92.

As counted from the reference time, when time t3 has arrived, delay circuit 91 supplies count signal Sp1 to count processing circuit 10. Thus, count processing circuit 10 performs the count processing. The count processing is similar to steps S43-S46 indicated in FIG. 4 and will not be described repeatedly.

Pulsed voltage source 102 is for example an optical sensor, a magnetic sensor, a piezoelectric sensor, or a similar sensor. In that case, for example whether a subject to be sensed exists can be sensed by the sensor and how many times the subject is sensed can be obtained. Furthermore, if pulsed voltage source 102 is a digital IC that outputs a logic signal, how many times the logic signal is received can be obtained.

Furthermore, as has been described above, counter 2 is capable of count processing for small electric energy. This allows pulsed voltage source 102 to be implemented with a power generating element generating a small amount of power. How many times the power generating element generates power can be obtained.

Counter 2 is compared for example with radio frequency identification (RFID). RFID allows a data signal to be communicated if power supply voltage is supplied for a short period of time. RFID allows a data signal to be communicated through a procedure specifically as follows: Initially, a RFID system receives a signal for supplying power supply voltage. This allows the RFID system to transition to a state allowing the system to communicate a data signal. Subsequently, the system starts communicating the data signal. In other words, in RFID, power supply voltage and the data signal are supplied to the system independently of each other.

In the second embodiment, in contrast, pulsed voltage Vp1 has a portion of its electric energy supplied to count processing circuit 10 as power supply voltage Vdd1 for count processing circuit 10. Furthermore, pulsed voltage Vp1 has another portion of its electric energy supplied to count processing circuit 10 as count signal Sp1. In other words, counter 2 generates both power supply voltage Vdd1 for count processing circuit 10 and count signal Sp1 from pulsed voltage Vp1.

As such, when pulsed voltage source 102 is seen as a signal source, it is unnecessary to provide a separate power supply circuit for supplying power supply voltage to count processing circuit 10. This allows for example a configuration simply of a sensor and counter 2 to be used to sense that a subject to be sensed exists and obtain how many times the subject is sensed.

Note that the circuit configuration of the second embodiment is also applicable when pulsed voltage source 102 supplies both positive and negative pulsed voltages and how many times positive pulsed voltage Vp1 is received is counted.

Third Embodiment

While the second embodiment has been described with pulsed voltage source 102 supplying pulsed voltage Vp1 positive in polarity, the pulsed voltage may be negative in polarity. A counter according to the present embodiment receives negative pulsed voltage.

Figure 7:
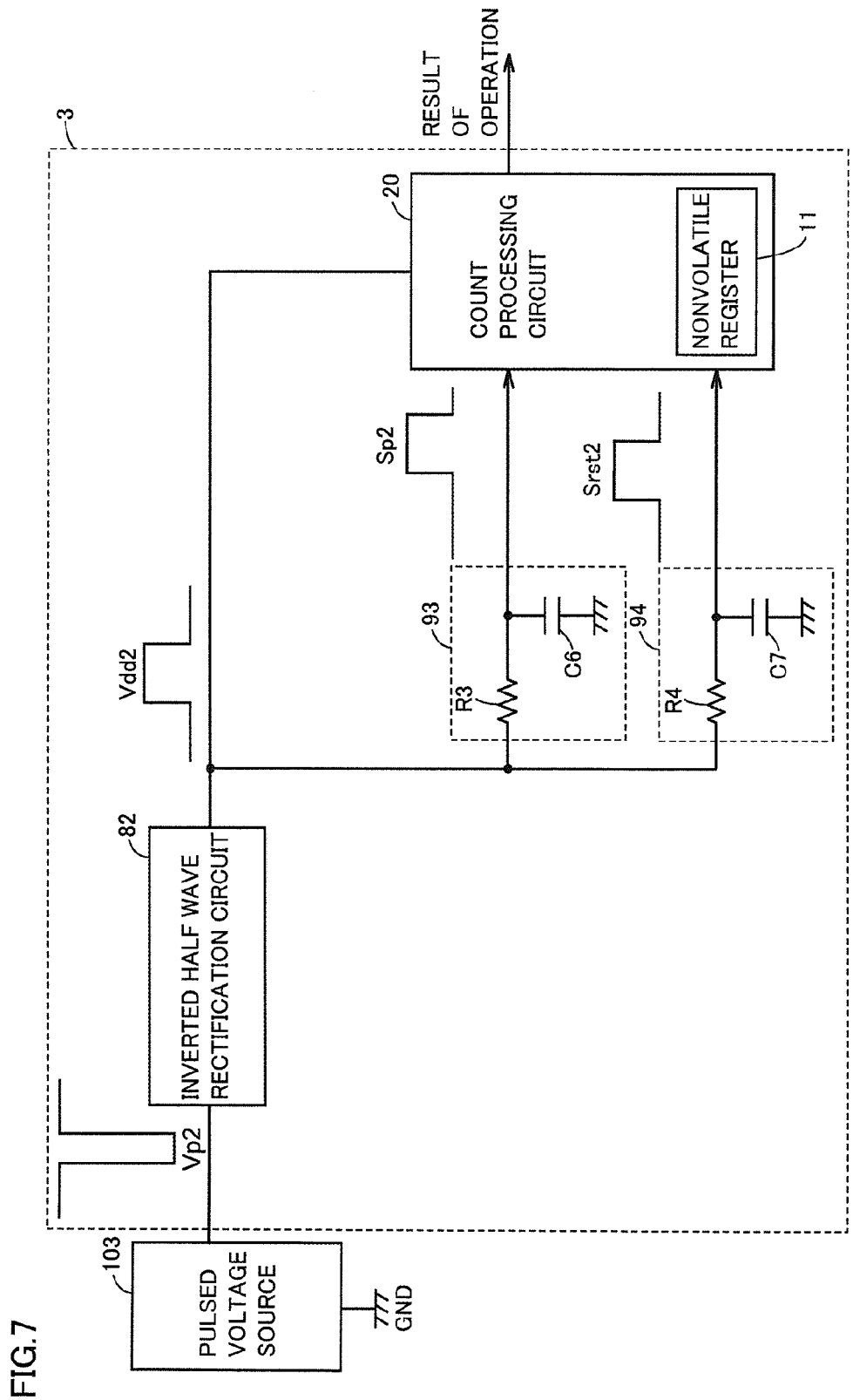
FIG. 7 is a block diagram schematically showing in configuration an electronic circuit according to a third embodiment of the present invention.

FIG. 7 is a block diagram schematically showing in configuration a counter 3 according to a third embodiment of the present invention. With reference to FIG. 7, counter 3 includes an inverted half wave rectification circuit 82, rather than half wave rectification circuit 81. Furthermore, counter 3 includes a count processing circuit 20 and delay circuits 93 and 94 corresponding to count processing circuit 10 and delay circuits 93 and 94.

A pulsed voltage source 103 outputs negative pulsed voltage Vp2 to inverted half wave rectification circuit 82. Negative pulsed voltage Vp2 is inverted to positive pulsed voltage by inverted half wave rectification circuit 82. The positive pulsed voltage is output as power supply voltage Vdd2. In contrast, when inverted half wave rectification circuit 82 receives an input positive in polarity or of zero (i.e., the potential of ground node GND), inverted half wave rectification circuit 82 has an output terminal (not shown) at a potential equal to that of ground node GND.

Delay circuit 93 includes a resistor R3 and a capacitor C6. Resistor R3 is connected in series between inverted half wave rectification circuit 82 and count processing circuit 20. Between resistor R3 and count processing circuit 20, capacitor C6 is provided between a ground node GND and a node provided between resistor R3 and count processing circuit 20. Delay circuit 93 receives power supply voltage Vdd2 from inverted half wave rectification circuit 82 and generates a count signal Sp2. Delay circuit 93 supplies to count processing circuit 20 count signal Sp2 delayed than power supply voltage Vdd2 supplied to delay circuit 93.

Delay circuit 94 includes a resistor R4 and a capacitor C7. Resistor R4 is connected in series between inverted half wave rectification circuit 82 and count processing circuit 20. Between resistor R4 and count processing circuit 20, capacitor C7 is provided between a ground node GND and a node provided between resistor R4 and count processing circuit 20. Delay circuit 94 outputs to signal processing circuit 20 a reset cancel signal Srst2 delayed than power supply voltage Vdd2 supplied to delay circuit 94. Count processing circuit 20 receives reset cancel signal Srst2 before count signal Sp2. The remainder of counter 3 is equivalent in configuration to that of counter 2 according to the second embodiment (see FIG. 5), and accordingly, will not be described repeatedly.

Figure 8:
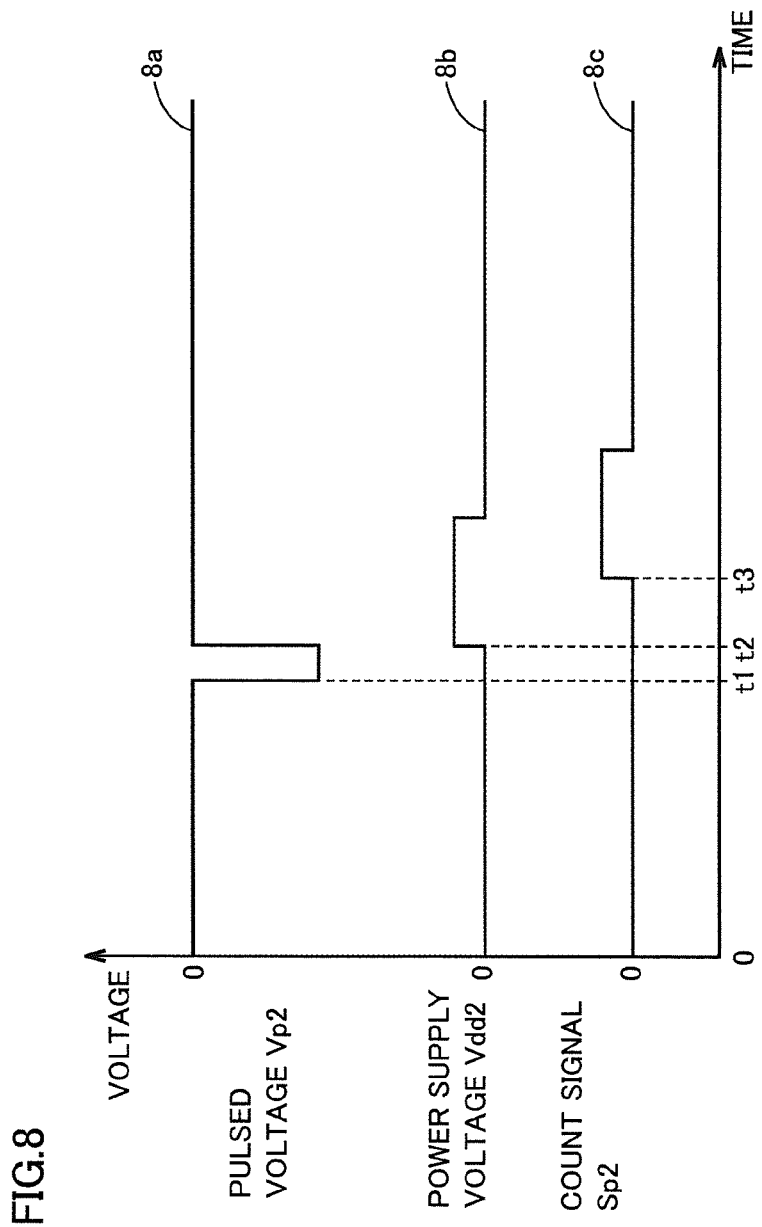
FIG. 8 is timing plots representing a relationship between input voltage, power supply voltage, and a voltage signal in the FIG. 7 electronic circuit as time elapses.

FIG. 8 is timing plots representing a relationship between pulsed voltage Vp2, power supply voltage Vdd2, and count signal Sp2 in the FIG. 7 counter 3 as time elapses. With reference to FIG. 6 and FIG. 8, waveforms 8a-8c are compared with waveforms 6a-6c, respectively.

As counted from the reference time, when time t1 has arrived, pulsed voltage source 103 supplies negative pulsed voltage Vp2 to inverted half wave rectification circuit 82.

As counted from the reference time, when time t2 has arrived, inverted half wave rectification circuit 82 supplies power supply voltage Vdd2. Power supply voltage Vdd2 is supplied to count processing circuit 20 and is also supplied to delay circuits 93 and 94.

As counted from the reference time, when time t3 has arrived, delay circuit 93 supplies count signal Sp2 to count processing circuit 20. Thus, count processing circuit 20 performs the count processing. The count processing is similar to steps S43-S46 indicated in FIG. 4 and will not be described repeatedly.

The half wave rectification circuit that accommodates pulsed voltage in polarity allows how many times negative pulsed voltage is received to be obtained. Note, however, that if the pulsed voltage source supplies pulsed voltage negative in polarity, it is not essential to invert that pulsed voltage to be positive in polarity. The half wave rectification circuit, the delay circuit, and the count processing circuit may each have a reference potential set as appropriate to eliminate the necessity of inverting negative pulsed voltage in counting how many times the negative pulsed voltage is received.

Fourth Embodiment

The second and third embodiments provide counters 2 and 3 receiving one of positive pulsed voltage and negative pulsed voltage from a pulsed voltage source. In the present embodiment, a pulsed voltage source supplies both positive and negative pulsed voltage.

Figure 9:
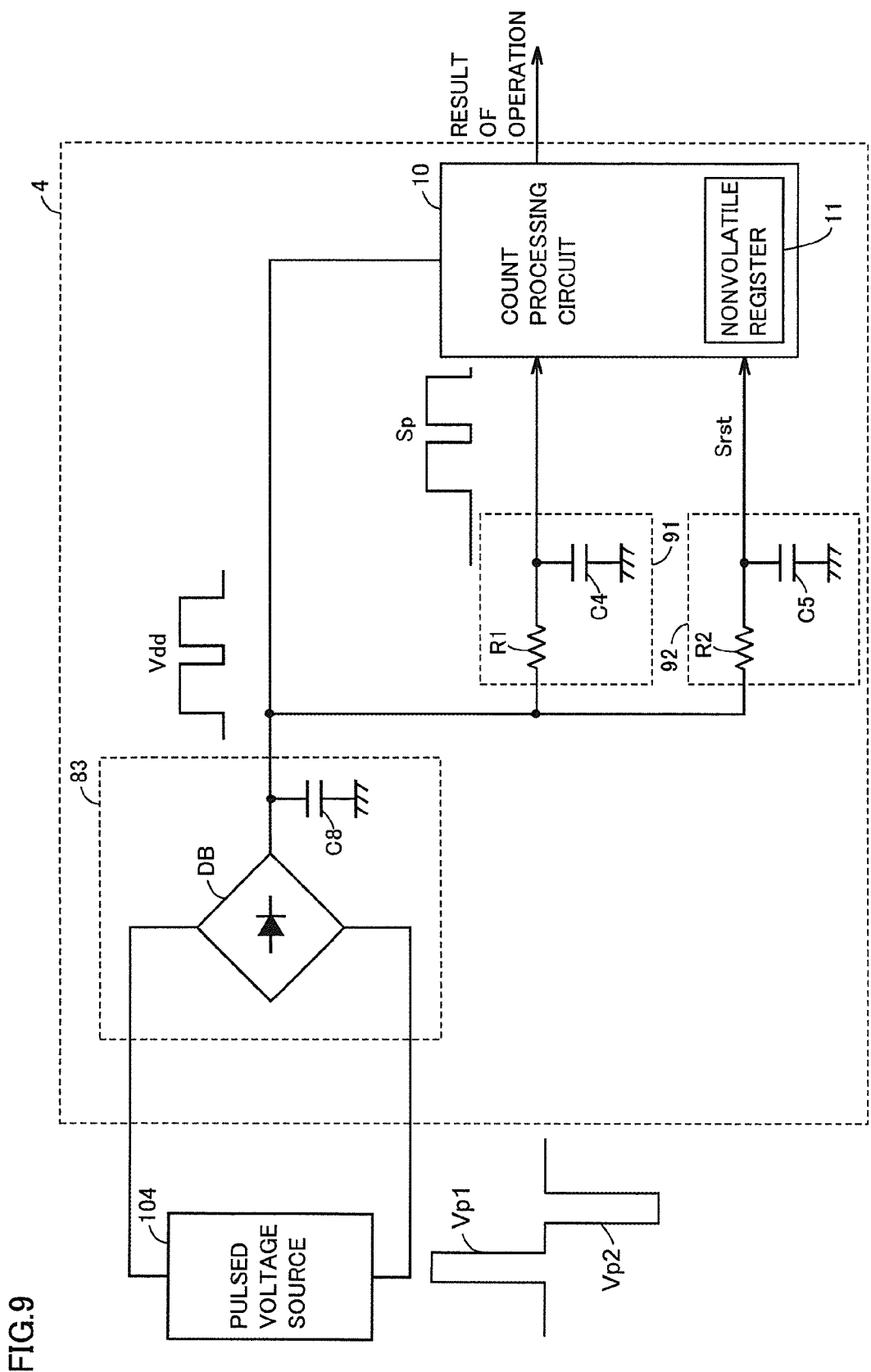
FIG. 9 is a block diagram schematically showing in configuration an electronic circuit according to a fourth embodiment of the present invention.

FIG. 9 is a block diagram schematically showing in configuration a counter 4 according to a fourth embodiment of the present invention. With reference to FIG. 9, counter 4 includes a full wave rectification circuit 83, rather than half wave rectification circuit 81. The remainder of counter 4 is equivalent in configuration to that of counter 2 according to the second embodiment, and accordingly, will not be described repeatedly.

A pulsed voltage source 104 outputs positive pulsed voltage Vp1 and negative pulsed voltage Vp2 to full wave rectification circuit 83. Note that pulsed voltages Vp1 and Vp2 are one example of the "input voltage" according to the present invention.

Full wave rectification circuit 83 includes a diode bridge DB and a capacitor C8. Diode bridge DB has a pair of nodes positioned in diagonal corners thereof and connected to pulsed voltage source 104 between output terminals. Diode bridge DB has an output with capacitor C8 connected thereto and between the output and a ground node GND. Diode bridge DB subjects pulsed voltage Vp to full wave rectification. The pulsed voltage having undergone full wave rectification is smoothed by capacitor C8. The smoothed voltage is output as power supply voltage Vdd. Note that full wave rectification circuit 83 is one example of the "voltage processing circuit" according to the present invention, and its circuit configuration is not limited to the above.

Figure 10:
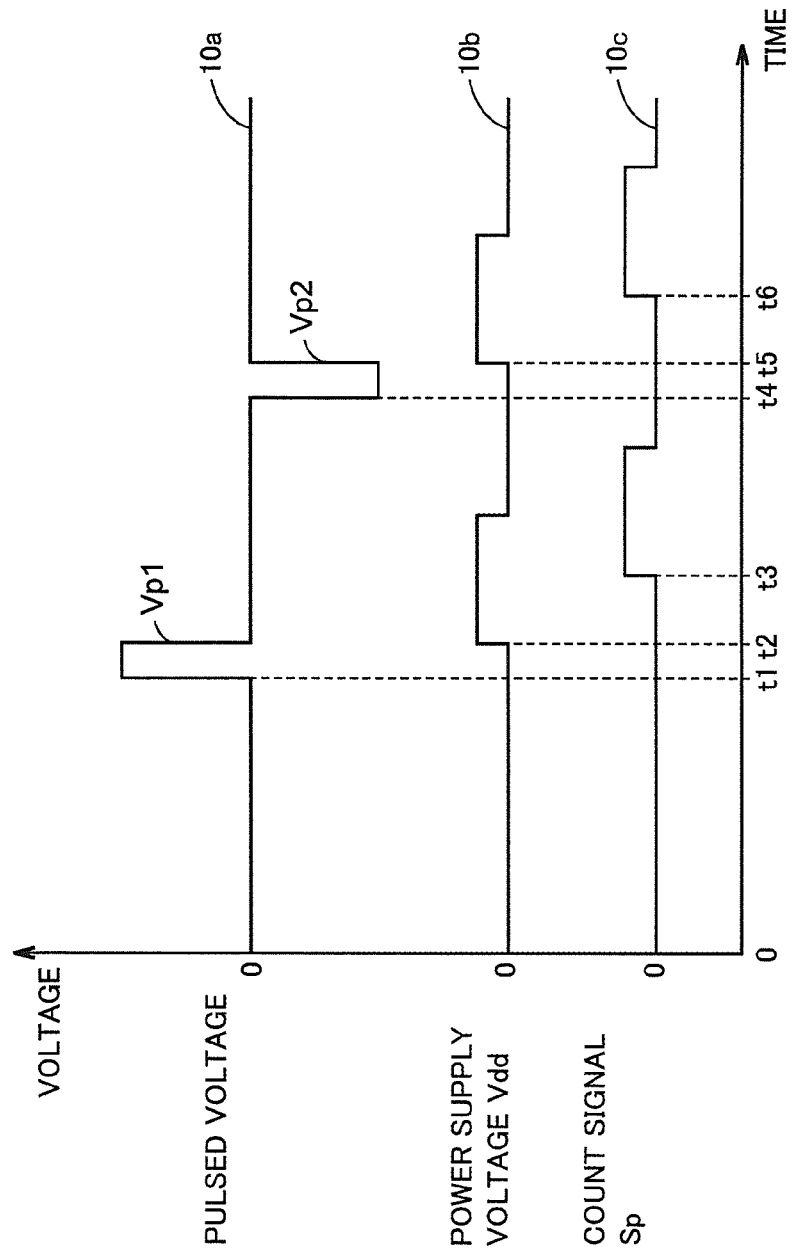
FIG. 10 is timing plots representing a relationship between input voltage, power supply voltage, and a voltage signal in the FIG. 9 electronic circuit as time elapses.

FIG. 10 is timing plots representing a relationship between pulsed voltage, power supply voltage Vdd, and count signal Sp in the FIG. 9 counter 4 as time elapses. With reference to FIG. 6 and FIG. 10, waveforms 10a-10c are compared with waveforms 6a-6c, respectively.

As counted from the reference time, when time t1 has arrived, pulsed voltage source 104 supplies positive pulsed voltage Vp1 to full wave rectification circuit 83.

As counted from the reference time, when time t2 has arrived, full wave rectification circuit 83 supplies power supply voltage Vdd. Power supply voltage Vdd is supplied to count processing circuit 10 and is also supplied to delay circuits 91, 92.

As counted from the reference time, when time t3 has arrived, delay circuit 91 supplies count signal Sp to count processing circuit 10. Thus, count processing circuit 10 performs the count processing. The count processing is similar to steps S43-S46 indicated in FIG. 4 and will not be described repeatedly.

Similarly, as counted from the reference time, when time t4 has arrived, pulsed voltage source 104 supplies negative pulsed voltage Vp2 to full wave rectification circuit 83.

As counted from the reference time, when time t5 has arrived, full wave rectification circuit 83 supplies power supply voltage Vdd. Power supply voltage Vdd is supplied to count processing circuit 10 and is also supplied to delay circuits 91, 92.

As counted from the reference time, when time t6 has arrived, delay circuit 91 supplies count signal Sp to count processing circuit 10. Thus, count processing circuit 10 performs the count processing. The count processing is similar to steps S43-S46 indicated in FIG. 4 and will not be described repeatedly.

Counter 4 according to the fourth embodiment can thus obtain how many times pulsed voltage Vp output from pulsed voltage source 104 is received in total, regardless of whether pulsed voltage Vp is positive or negative in polarity.

Fifth Embodiment

Counter 4 according to the fourth embodiment obtains how many times pulsed voltage is received in total, regardless of whether the pulsed voltage is positive or negative in polarity. In the present embodiment, how many times positive pulsed voltage is received and how many times negative pulsed voltage is received are independently counted.

Figure 11:
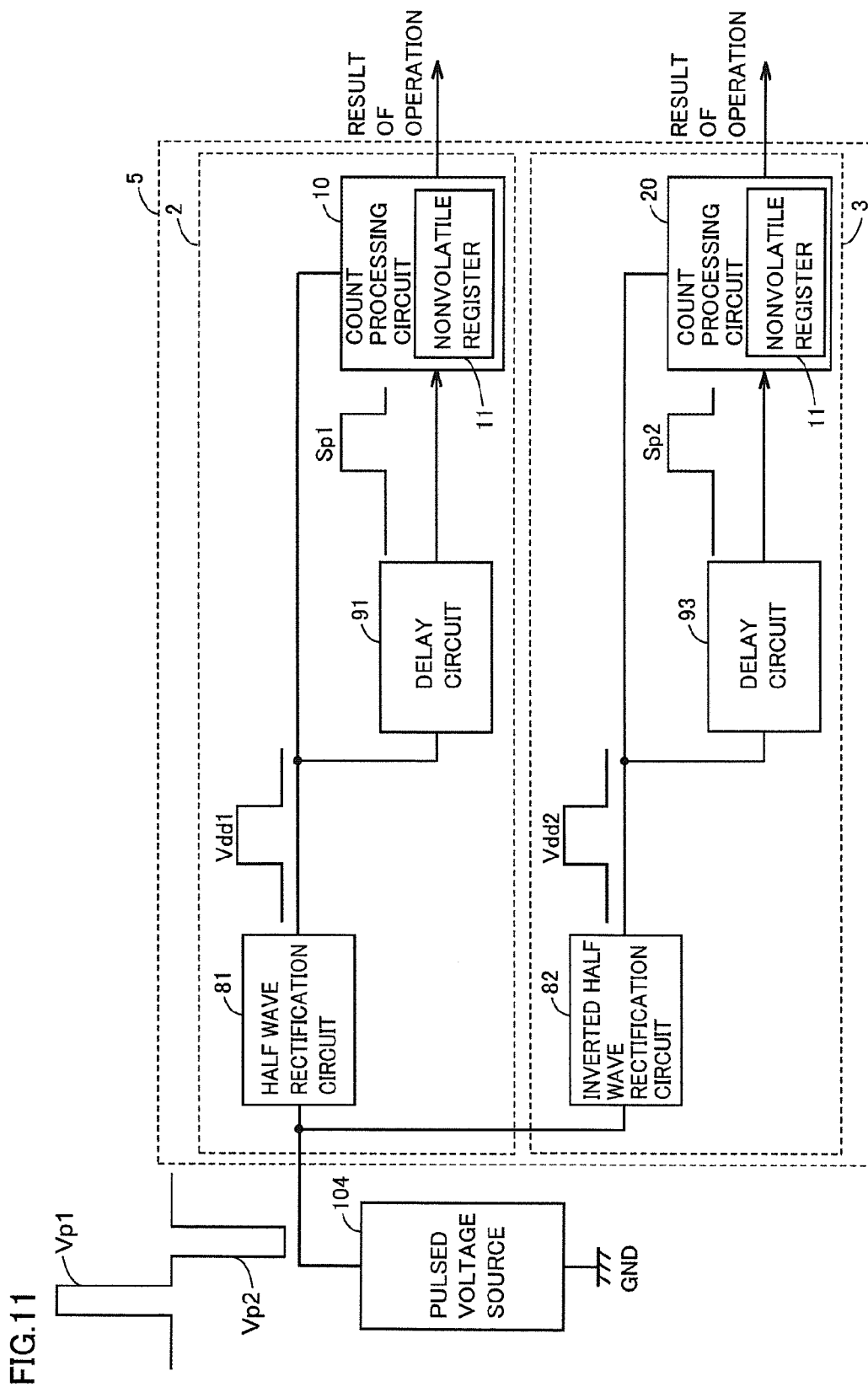
FIG. 11 is a block diagram schematically showing in configuration an electronic circuit according to a fifth embodiment of the present invention.

FIG. 11 is a block diagram schematically showing in configuration a counter 5 according to a fifth embodiment of the present invention. With reference to FIG. 11, counter 5 employs counter 2 of the second embodiment and counter 3 of the third embodiment in combination. Positive pulsed voltage Vp1 is processed by counter 2. Counter 2 includes half wave rectification circuit (a first half wave rectification circuit) 81, count processing circuit (a first signal processing unit) 10, and delay circuit 91. Negative pulsed voltage Vp2 is processed by counter 3. Counter 3 includes inverted half wave rectification circuit (a second half wave rectification circuit) 82, count processing circuit (a second signal processing unit) 20, and delay circuit 93. Note that count processing circuits 10 and 20 each receive reset cancel signal Srst (not shown). These reset cancel signals Srst are supplied from a delay circuit (not shown).

Figure 12:
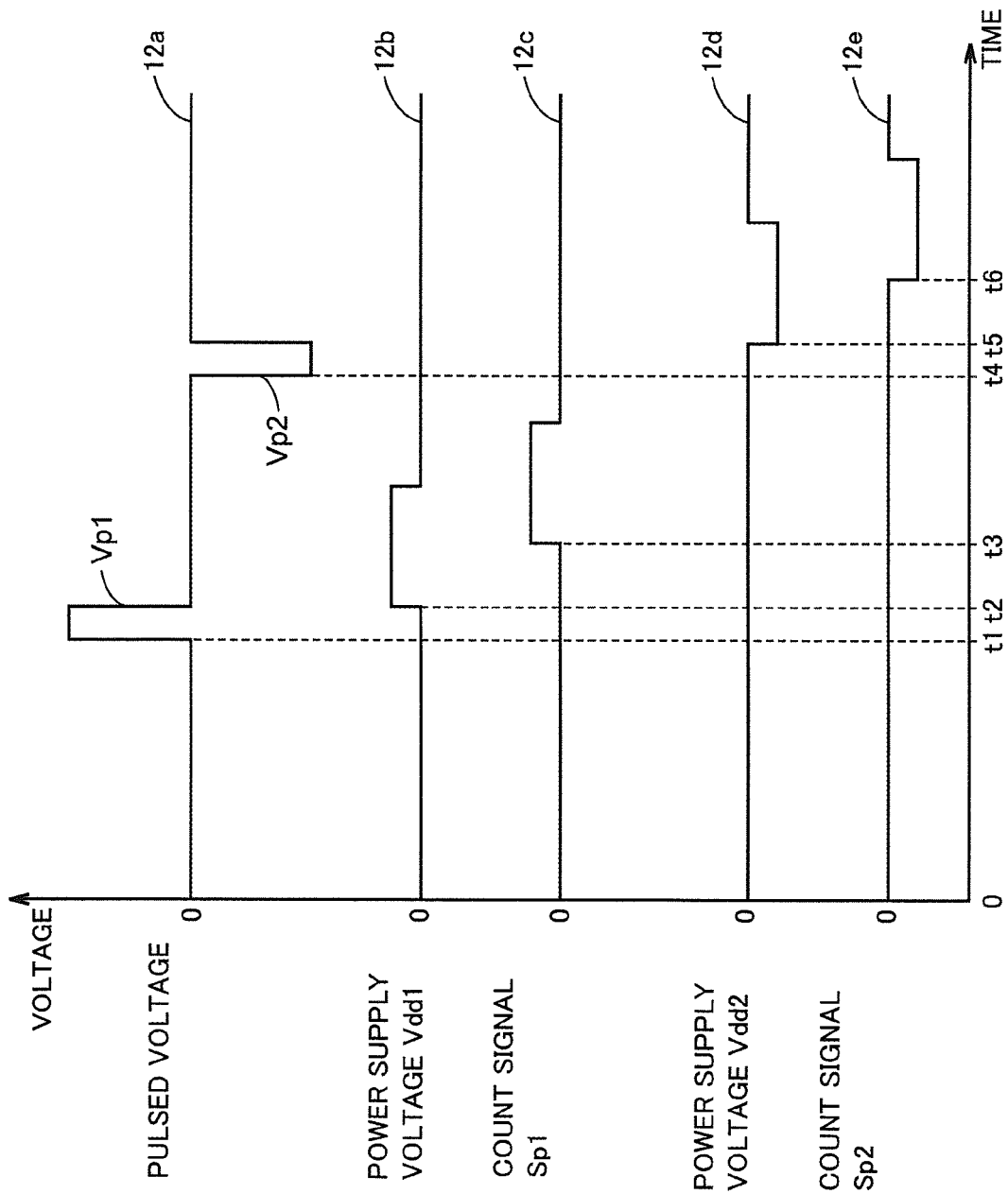
FIG. 12 is timing plots representing a relationship between input voltage, power supply voltage, and a voltage signal in the FIG. 11 electronic circuit as time elapses.

FIG. 12 is timing plots representing a relationship between pulsed voltages Vp1 and Vp2, power supply voltages Vdd1 and Vdd2, and count signals Sp1 and Sp2 in the FIG. 10 counters 2 and 3 as time elapses. With reference to FIG. 6 and FIG. 12, a waveform 12a is compared with waveform 6a. Waveforms 12b and 12d are each compared with waveform 6b. Waveforms 12c and 12e are each compared with waveform 6c. Waveforms 12b and 12c are each derived from positive pulsed voltage Vp1. Waveforms 12d and 12e are each derived from negative pulsed voltage Vp2.

With reference to FIG. 12, as counted from the reference time, when time t1 has arrived, pulsed voltage source 104 supplies positive pulsed voltage Vp1 to half wave rectification circuit 81.

As counted from the reference time, when time t2 has arrived, half wave rectification circuit 81 supplies power supply voltage Vdd1. Power supply voltage Vdd1 is supplied to count processing circuit 10 and is also supplied to delay circuit 91.

As counted from the reference time, when time t3 has arrived, delay circuit 91 supplies count signal Sp1 to count processing circuit 10. Thus, count processing circuit 10 performs the count processing. The count processing is similar to steps S43-S46 indicated in FIG. 4 and will not be described repeatedly.

Similarly, as counted from the reference time, when time t4 has arrived, pulsed voltage source 104 supplies negative pulsed voltage Vp2 to inverted half wave rectification circuit 82.

As counted from the reference time, when time t5 has arrived, inverted half wave rectification circuit 82 supplies power supply voltage Vdd2. Power supply voltage Vdd2 is supplied to count processing circuit 20 and is also supplied to delay circuit 93.

As counted from the reference time, when time t6 has arrived, delay circuit 93 supplies count signal Sp2 to count processing circuit 20. Thus, count processing circuit 20 performs the count processing. The count processing is similar to steps S43-S46 indicated in FIG. 4 and will not be described repeatedly.

Counter 5 according to the fifth embodiment can thus count how many times positive pulsed voltage is received and how many times negative pulsed voltage is received independently.

Sixth Embodiment

Counters 1-5 according to the first to fifth embodiments are applicable to electronic devices for example such as mobile phones, household electrical appliances, and office automation (OA) devices.

Figure 13:
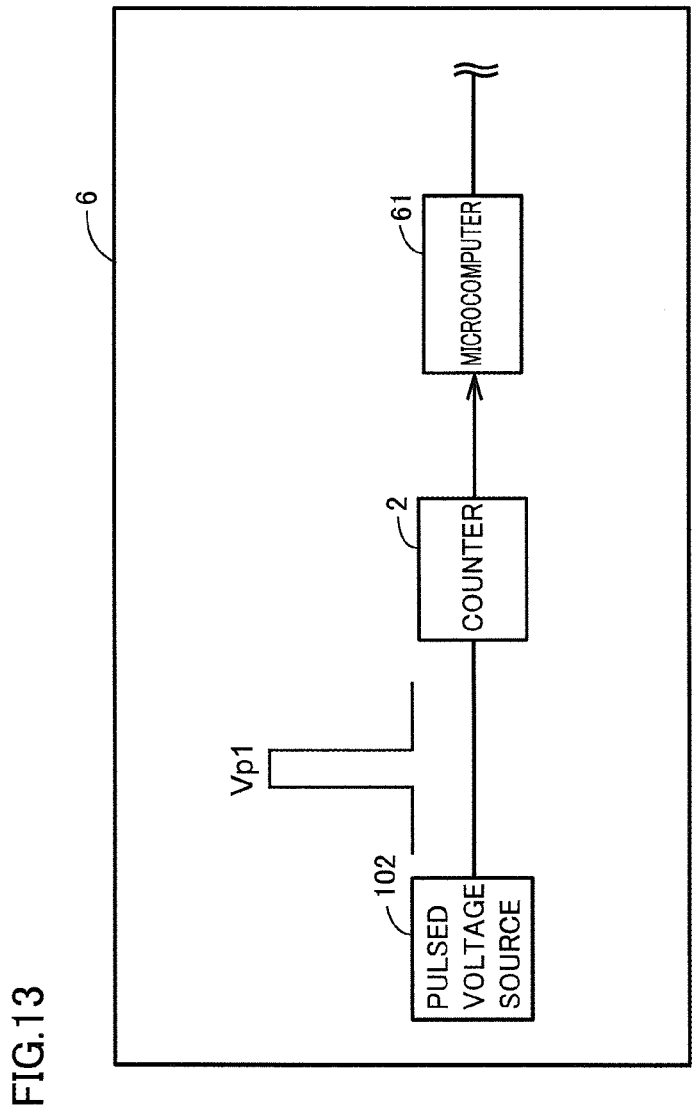
FIG. 13 is a block diagram showing a schematic configuration of an electronic device according to a sixth embodiment of the present invention.

FIG. 13 is a block diagram showing a schematic configuration of an electronic device 6 according to a sixth embodiment of the present invention. With reference to FIG. 13, electronic device 6 includes pulsed voltage source 102, counter 2, and a microcomputer 61.

Microcomputer 61 generally controls how electronic device 6 operates. Counter 2 counts how many times pulsed voltage source 102 inputs pulsed voltage Vp1. Microcomputer 61 receives from counter 2 a signal indicating a result of the count processing.

Electronic device 6 including counter 2 can thus be implemented. Note that, in the present specification, an "electronic device" refers to electronically engineered electric products in general. The electronic device for example includes, but is not limited to, factory automation (FA) devices and other similar industrial devices, and automobiles and other similar vehicles. Furthermore, in place of counter 2 according to the second embodiment, counters 3-5 according to the third to fifth embodiments may be applied to electronic device 6.

Counter 1 according to the first embodiment thus counts how many times power supply is input. Counters 2-5 according to the second to fifth embodiments count how many times a pulsed voltage source inputs pulsed voltage. It should be noted, however, that how the present electronic circuit processes a signal is not limited to the above. The present electronic circuit generates power supply voltage and a voltage signal, based on voltage received from a voltage source, for a signal processing circuit. How the signal processing circuit processes a signal is unquestioned as long as it does so by using the voltage signal. The present invention is also applicable for example to an encoder.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An electronic circuit comprising:
   a signal processing circuit including a storage unit to hold information in a non-volatile manner;
   a voltage processing circuit receiving voltage from a voltage source, generating power supply voltage based on the received voltage for said signal processing circuit, and supplying said power supply voltage to said signal processing circuit; and
   a delay circuit receiving said power supply voltage and supplying a voltage signal to said signal processing circuit after said power supply voltage is supplied to said signal processing circuit,
   after having received said power supply voltage from said voltage processing circuit, said signal processing circuit updating said information in response to said voltage signal and holding the updated information in said storage unit in the non-volatile manner.

2. The electronic circuit according to claim 1, wherein said delay circuit monitors said power supply voltage, and once said power supply voltage has attained a value equal to or larger than a reference value, said delay circuit outputs a reset cancel signal to said signal processing circuit for allowing said signal processing circuit to shift from a state disallowing said information to be updatable to a state allowing said information to be updatable, and after said delay circuit has output said reset cancel signal to said signal processing circuit, said delay circuit outputs said voltage signal to said signal processing circuit.

3. The electronic circuit according to claim 1, wherein:
   said voltage source is a direct current power supply; and
   when said direct current power supply is turned on, said voltage processing circuit generates said power supply voltage based on direct current voltage provided from said direct current power supply.

4. The electronic circuit according to claim 1, wherein:
   said voltage source is a pulsed power supply that outputs pulsed voltage having one of positive and negative polarities;
   said voltage processing circuit includes a half wave rectification circuit corresponding to said polarity of said pulsed voltage; and
   said half wave rectification circuit generates said power supply voltage by subjecting said pulsed voltage received from said pulsed power supply to half wave rectification.

5. The electronic circuit according to claim 1, wherein:
   said voltage source is a pulsed power supply that outputs pulsed voltage of both positive and negative polarities;
   said voltage processing circuit includes a full wave rectification circuit; and
   said full wave rectification circuit generates said power supply voltage by subjecting said pulsed voltage received from said pulsed power supply to full wave rectification.

6. The electronic circuit according to claim 1, wherein:
   said voltage source is a pulsed power supply that outputs pulsed voltage of both positive and negative polarities;
   said voltage processing circuit includes a first half wave rectification circuit and a second half wave rectification circuit;

said signal processing circuit includes a first signal processing unit and a second signal processing unit;
said first and second signal processing units have first and second storage units, respectively;
said first half wave rectification circuit generates first power supply voltage as said power supply voltage by subjecting said pulsed voltage that is positive in polarity to half wave rectification;
said second half wave rectification circuit generates second power supply voltage as said power supply voltage by subjecting said pulsed voltage that is negative in polarity to half wave rectification;
said first signal processing unit receives said first power supply voltage generated by said first half wave rectification circuit; and
said second signal processing unit receives said second power supply voltage generated by said second half wave rectification circuit.

7. A counter for counting how many times a power supply is turned on, comprising:
a signal processing circuit receiving power supply voltage as said power supply is turned on, and holding in a non-volatile manner a count value indicating said how many times said power supply is turned on;
a first delay circuit monitoring said power supply voltage and outputting a first voltage signal to said signal processing circuit once said power supply voltage has attained a value equal to or larger than a reference value; and
a second delay circuit outputting a second voltage signal to said signal processing circuit after said first delay circuit has output said first voltage signal,
in response to said first voltage signal received, said signal processing circuit shifting from a state disallowing said count value to be updatable to a state allowing said count value to be updatable, and furthermore, in response to said second voltage signal received, said signal processing circuit updating said count value and holding the updated count value in the non-volatile manner.

8. An electronic device comprising an electronic circuit including:
a signal processing circuit including a storage unit to hold information in a non-volatile manner;
a voltage processing circuit receiving voltage from a voltage source, generating power supply voltage based on the received voltage for said signal processing circuit, and supplying said power supply voltage to said signal processing circuit; and
a delay circuit receiving said power supply voltage and supplying a voltage signal to said signal processing circuit after said power supply voltage is supplied to said signal processing circuit,
after having received said power supply voltage from said voltage processing circuit, said signal processing circuit updating said information in response to said voltage signal and holding the updated information in said storage unit in the non-volatile manner.

* * * * *